(12) United States Patent
Yang

(10) Patent No.: US 7,446,409 B2
(45) Date of Patent: Nov. 4, 2008

(54) CAVITY-DOWN MULTIPLE-CHIP PACKAGE

(75) Inventor: Ching-Hsu Yang, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 43 days.

(21) Appl. No.: 11/253,618

(22) Filed: Oct. 20, 2005

(65) Prior Publication Data

US 2006/0087009 A1 Apr. 27, 2006

(30) Foreign Application Priority Data

Oct. 21, 2004 (TW) ............................... 93132000 A

(51) Int. Cl.
*H01L 23/10* (2006.01)
(52) U.S. Cl. ............................... 257/707; 257/E23.101
(58) Field of Classification Search .................. 257/706, 257/707
See application file for complete search history.

(56) References Cited

U.S. PATENT DOCUMENTS

| | | | | |
|---|---|---|---|---|
| 5,444,296 A | * | 8/1995 | Kaul et al. | 257/686 |
| 5,567,983 A | * | 10/1996 | Hirano et al. | 257/722 |
| 5,583,377 A | * | 12/1996 | Higgins, III | 257/707 |
| 5,751,063 A | * | 5/1998 | Baba | 257/723 |
| 6,590,281 B2 | * | 7/2003 | Wu et al. | 257/684 |
| 6,664,617 B2 | * | 12/2003 | Siu | 257/669 |
| 6,879,031 B2 | * | 4/2005 | Wang | 257/686 |
| 2002/0053731 A1 | * | 5/2002 | Chao et al. | 257/706 |
| 2003/0085462 A1 | * | 5/2003 | Aquien et al. | 257/706 |
| 2004/0164404 A1 | * | 8/2004 | Huang | 257/706 |

FOREIGN PATENT DOCUMENTS

TW 577153 12/1991

* cited by examiner

*Primary Examiner*—David A Zarneke
(74) *Attorney, Agent, or Firm*—Volentine & Whitt, P.L.L.C.

(57) ABSTRACT

A cavity-down multiple-chip package mainly includes a heat spreader, a circuit substrate with an opening, a chip, and at least one electronic element; wherein an upper surface of the circuit substrate defines at least one element mounting area; the heat spreader is disposed on said upper surface of the circuit substrate; and the element mounting area is exposed for disposing these electronic elements. A cavity is formed by the opening of the circuit substrate and the heat spreader and is used for accommodating the chip. A plurality of solder balls can be disposed on a lower surface of the circuit substrate.

5 Claims, 3 Drawing Sheets

CAVITY-DOWN MULTIPLE-CHIP PACKAGE

BACKGROUND OF THE INVENTION

1. Field of the Invention

The present invention relates to a cavity-down chip package, and more particularly to a cavity-down multiple-chip package without enlarging the size of the circuit substrate.

2. Description of the Related Art

As electronic products gradually become thinner and lighter, the chips or the micro-electronic element comprising chips are not only reduced in volume, but also further densely packaged into a multiple-chip package. Thus, the multiple-chip package will generate a higher temperature during operation. Furthermore, the multiple-chip package is usually appropriately modified depending on the configuration of the package, resulting in an enlarged size of the circuit substrate, and accordingly deteriorated overall heat spreading effects.

A conventional configuration of the chip package is a Cavity-Down Ball Grid Array package, wherein a heat spreader is attached to a substrate with an opening, so as to form a chip carrier with a cavity facing downwards. At least one chip is accommodated within said opening and attached to the heat spreader, so as to enhance the heat spreading effects.

Referring to FIG. 1, a cavity-down multiple-chip package 100 comprises a heat spreader 110 and a circuit substrate 120. The circuit substrate 120 comprises an upper surface 121 and a lower surface 122. The heat spreader 110 is attached to the upper surface 121 of the circuit substrate 120. A cavity is formed by an opening 123 of the circuit substrate 120 and the heat spreader 110, and is used for accommodating a plurality of chips 130. The chips 130 are attached to the heat spreader 110 to enhance the heat spreading effects. A plurality of solder pads 131 of the chips 130 are connected to a plurality of connecting pads 124 of the circuit substrates 120 by a plurality of bonding wires 140, such that the chips 130 are electrically connected to the circuit substrate 120. A molding compound 150 is formed within the cavity, for sealing the chips 130 and the bonding wires 140. A plurality of ball pads 125 are formed on the lower surface 122 of the circuit substrate 120, and are used for being disposed with a plurality of solder balls 160. Since the chips 130 of the cavity-down multiple-chip package 100 are adhered to the heat spreader 110 on the same plane, the sizes of the circuit substrate 120 and the opening 123 must be enlarged in order to accommodate the chips 130, which in turn accordingly enlarge the footprint of the cavity-down multiple-chip package 100 jointed to a printed circuit board. Therefore, such a conventional configuration is unsuitable for electronic products with small volumes.

ROC (Taiwan) Patent Publication No. 577153, entitled "Cavity-Down Multiple-Chip Package", discloses a cavity-down multiple-chip package. A cavity is defined by a heat spreader connected with a substrate with an opening; a carrier board for line redistribution and transmission is disposed on the heat spreader and accommodated within the cavity, for being disposed with a plurality of semiconductor chips. These semiconductor chips do not directly contact the heat spreader, thus the heat spreading effect is poor. In addition, since the carrier board for line redistribution and transmission is accommodated within the cavity, the sizes of the cavity and the substrate must be enlarged, such that the footprint of the cavity-down multiple-chip package is enlarged accordingly.

Consequently, there is an existing need for a cavity-down multiple-chip package to solve the above-mentioned problems.

SUMMARY OF THE INVENTION

The object of the present invention is to provide a cavity-down multiple-chip package, wherein an upper surface of a circuit substrate defines at least one element mounting area; a heat spreader is disposed on the upper surface, and the element mounting area is exposed; a cavity is formed by an opening of the circuit substrate and the heat spreader, for accommodating a chip; and an electronic element is disposed on the element mounting area, so as to bond to the upper surface of the circuit substrate, without enlarging the sizes of the opening and the substrate, such that the footprint of the cavity-down multiple-chip package is not necessarily enlarged.

Another object of the present invention is to provide a cavity-down multiple-chip package, wherein a first heat spreader is attached to an upper surface of a circuit substrate; at least one electronic element is disposed on said upper surface of the circuit substrate; and a second heat spreader is stacked on the first heat spreader, and thermally coupled to the electronic elements, for enhancing the heat spreading effects of the cavity-down multiple-chip package.

The cavity-down multiple-chip package according to the present invention mainly comprises a heat spreader, a circuit substrate, a chip, a molding compound, and at least one electronic element. The circuit substrate is provided with an upper surface, a lower surface, and an opening. The heat spreader is disposed on the upper surface of the circuit substrate, such that the opening and the heat spreader form a cavity for accommodating the chip. And the upper surface of the circuit substrate defines at least one element mounting area exposed to the heat spreader. The chip is accommodated within the cavity and electrically connected to the circuit substrate. The molding compound is formed within the cavity for sealing the chip. The electronic elements are disposed on the element mounting areas on the upper surface of the circuit substrate through the heat spreader.

DETAILED DESCRIPTION OF THE INVENTION

With reference to the accompanying drawings, the present invention will be illustrated through the following embodiments.

Figure 1:
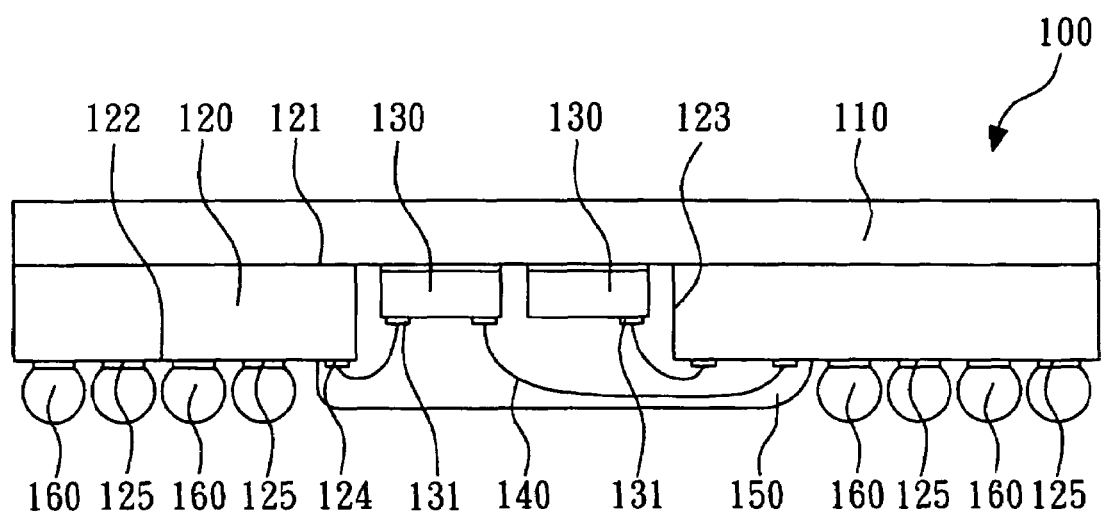
FIG. 1 is a schematic cross-sectional view of a conventional cavity-down multiple-chip package.
Figure 2:
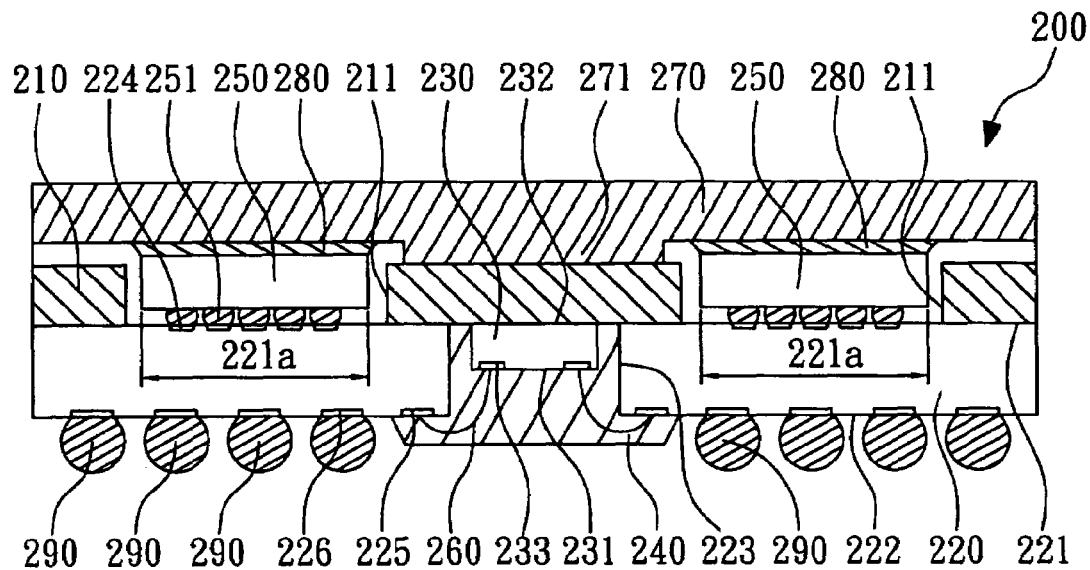
FIG. 2 is a schematic cross-sectional view of a cavity-down multiple-chip package according to a first embodiment of the present invention.
Figure 3:
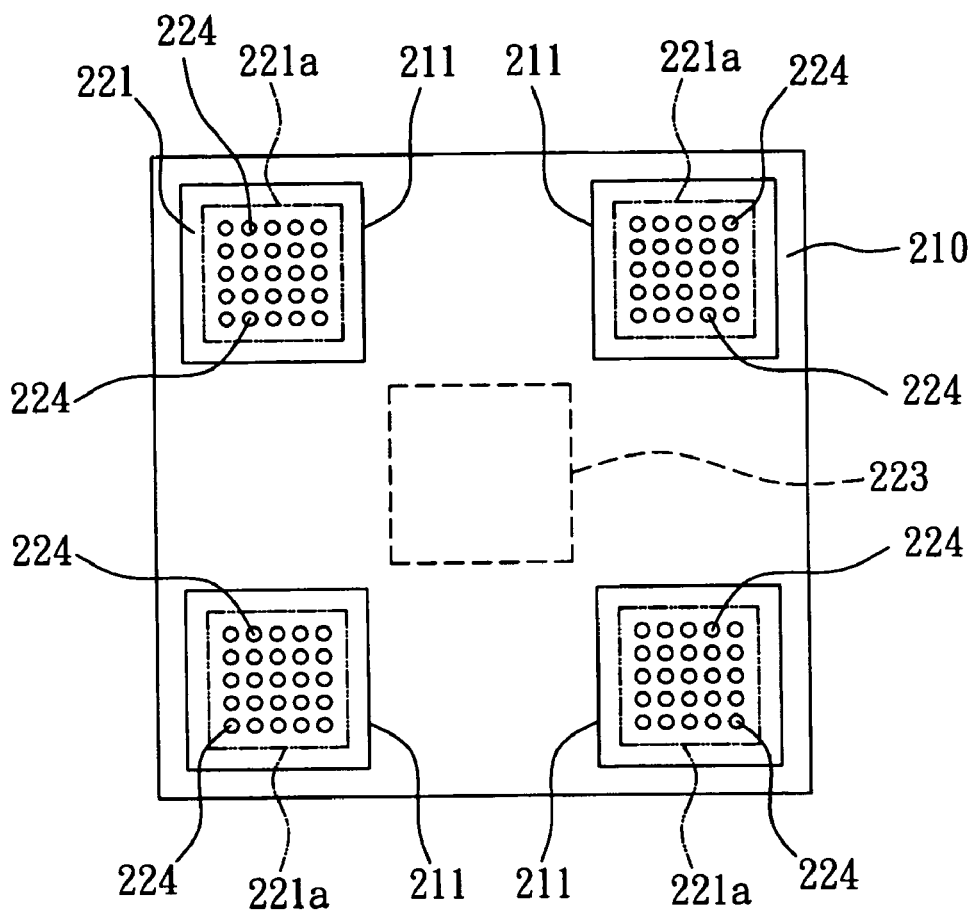
FIG. 3 is a schematic view of an upper surface of the circuit substrate and the first heat spreader of the cavity-down multiple-chip package.

Referring to FIG. 2, according to a first embodiment of the present invention, a cavity-down multiple-chip package 200 mainly comprises a first heat spreader 210, a circuit substrate 220, a chip 230, a molding compound 240, and a plurality of electronic elements 250. Referring to FIG. 2 and FIG. 3, in this embodiment, the first heat spreader 210 comprises a plurality of through holes 211, which pass through the upper and lower surfaces of the first heat spreader 210. The materials of the first heat spreader 210 may comprise copper or other metals.

Referring to FIG. 2 again, the circuit substrate 220 is provided with an upper surface 221, a lower surface 222 and an opening 223, wherein the upper surface 221 defines a plurality of element mounting areas 221a, and the opening 223 passes through the upper surface 221 and the lower surface 222. The first heat spreader 210 is a flat plate and disposed on the upper surface 221 of the circuit substrate 220. In this embodiment, the through holes 211 of the first heat spreader 210 do not communicate with the opening 223 of the circuit substrate 220, and these through holes 211 of the first heat spreader 210 correspond to the element mounting areas 221a so as to expose the element mounting areas 221a. Within these element mounting areas 221a, a plurality of mounting pads 224 are formed, on which the electronic elements 250 are disposed. That is, the electronic elements 250 are disposed in the through holes of the first heat spreader 210. In addition, a cavity for accommodating the chip 230 is formed by the opening 223 of the circuit substrate 220 and the first heat spreader 210. The opening of the cavity faces downwardly. In this embodiment, the opening 223 is located in the central area of the circuit substrate 220, whereas these element mounting areas 221a are located at the peripheral areas of the upper surface 221 of the circuit substrate 220 and are around the opening 223. It is understood that the through holes 211 of the first heat spreader 210 are located at the peripheral areas of the upper surface 221 of the circuit substrate 220.

The chip 230 is provided with an active surface 231 and a non-active surface 232. The chip 230 further comprises a plurality of solder pads 233 formed on the active surface 231, and it is accommodated within the cavity and directly adhered to the first heat spreader 210. The solder pads 233 of the chip 230 are electrically connected to a plurality of connecting pads 225 of the circuit substrate 220 by a plurality of bonding wires 260. Preferably, the connecting pads 225 are formed on the lower surface 222 and located at the periphery of the opening 223, in order to reduce the length of the bonding wires 260.

The molding compound 240 may be formed within the cavity by means of molding and dispensing so as to seal the chip 230 and the bonding wires 260.

The electronic elements 250 are disposed on the upper surface 221 of the circuit substrate 220, and are selected from a group consisting of Flip Chip, Chip Size Package (CSP) and Ball Grid Array (BGA). The electronic elements 250 are jointed to the mounting pads 224 of the element mounting areas 211a by a plurality of bumps or solder balls. In this embodiment, these electronic elements 250 are the Chip Size Packages that are jointed to the mounting pads 224 by a plurality of solder balls 251.

In this embodiment, a second heat spreader 270 is stacked on the first heat spreader 210. The second heat spreader 270 comprises a protrusion 271 formed on the central area of the second heat spreader 270. The second heat spreader 270 may be connected to the first heat spreader 210 with the protrusion 271 corresponding to the opening 223. Preferably, a heat spreading adhesive 280 is formed on these electronic elements 250 and enables the electronic elements 250 to be physically connected and thermally coupled to the second heat spreader 270 so as to enhance the heat spreading effect of these electronic elements 250. On the lower surface 222 of the circuit substrate 220, a plurality of ball pads 226 may be formed, on which a plurality of solder balls 290 are disposed.

As for the above-mentioned cavity-down multiple-chip package 200, the chip 230 is accommodated within the cavity formed by the opening 223 of the circuit substrate 220 and the first heat spreader 210; and the electronic elements 250 are disposed on the upper surface 221 of the circuit substrate 220 and electrically connected to the circuit substrate 220, so as to achieve high-density packaging of the chip 230 and these electronic elements 250. The circuit substrate 220 is designed with a proper dimension, without enlarging the footprint of the cavity-down multiple-chip package 200 for jointing to the surfaces.

Figure 4:
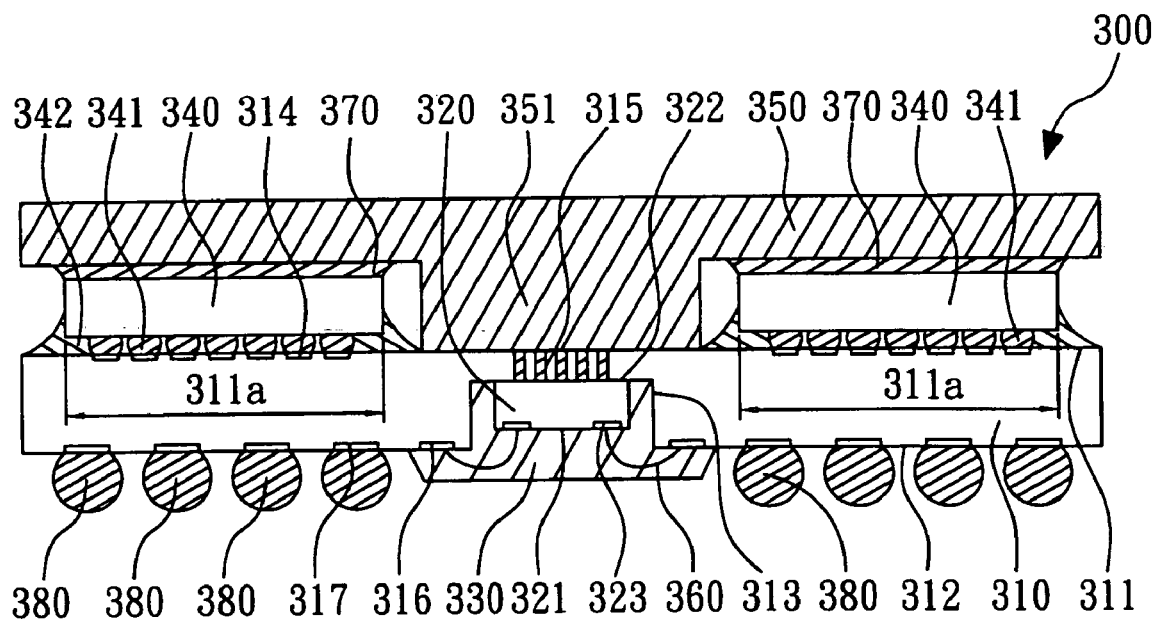
FIG. 4 is a schematic cross-sectional view of a cavity-down multiple-chip package according to a second embodiment of the present invention.

Referring to FIG. 4, according to the second embodiment of the present invention, a cavity-down multiple-chip package 300 mainly comprises a circuit substrate 310, a chip 320, a molding compound 330, a plurality of electronic elements 340, and a heat spreader 350.

The circuit substrate 310 is provided with an upper surface 311, a lower surface 312 and a cavity 313 with an opening facing the lower surface 312. The upper surface 311 of the circuit substrate 310 defines a plurality of element mounting areas 311a that have a plurality of mounting pads 314 formed therein. These electronic elements 340 are disposed in the element mounting areas 311a. Preferably, the circuit substrate 310 is provided with a plurality of thermal vias 315, which pass from the bottom surface of the cavity 313 to the upper surface 311 of the circuit substrate 310. That is, the thermal vias 315 communicate with the cavity 313.

The chip 320 is provided with an active surface 321 and a non-active surface 322, and further comprises a plurality of solder pads 323 formed on the active surface 321. The chip 320 is accommodated in the cavity 313 and is mounted to the circuit substrate 310. These thermal vias 315 of the circuit substrate 220 can be used for transferring heat generated during the operation of the chip 320. A plurality of bonding wires 360 are used for electrically connecting the solder pads 323 of the chip 320 and a plurality of connecting pads 316 of the circuit substrate 310. The molding compound 330 is formed within the cavity 313 and is used for sealing the chip 320 and the bonding wires 360.

The electronic elements 340 are disposed in the element mounting areas 311a of the circuit substrate 310. In this embodiment, these electronic elements 340 are flip chips that are flip-chip bonded to the mounting pads 314 of the element mounting areas 311a by a plurality of bumps 341. A filling adhesive 342 is filled in the gaps between these bumps 341.

The heat spreader 350 is disposed on the upper surface 311 of the circuit substrate 310. The heat spreader 350 is provided with a protrusion 351, and is connected to the circuit substrate 310 by the protrusion 351 corresponding to the cavity 313. Through these thermal vias 315 of the circuit substrate 310, the heat generated during the operation of the chip 320 is transferred to the heat spreader 350 to enhance the heat spreading effect. In this embodiment, a heat spreading adhesive 370 is formed on the electronic elements 340, and is used for physically connecting and thermally coupling these electronic elements 340 to the heat spreader 350. A plurality of ball pads 317 are formed on the lower surface 312 of the circuit substrate 310, and are used for being disposed by a plurality of solder balls 380.

As for the above-mentioned cavity-down multiple-chip package 300, the chip 320 is accommodated within the cavity 313 with an opening facing the lower surface 312. These electronic elements 340 are disposed on the element mounting areas 311a on the upper surface 311 of the circuit substrate 310 to achieve high-density packaging of the chip 320 and the electronic elements 340, such that the footprint of the cavity-down multiple-chip package 300 may not be too large.

Figure 5:
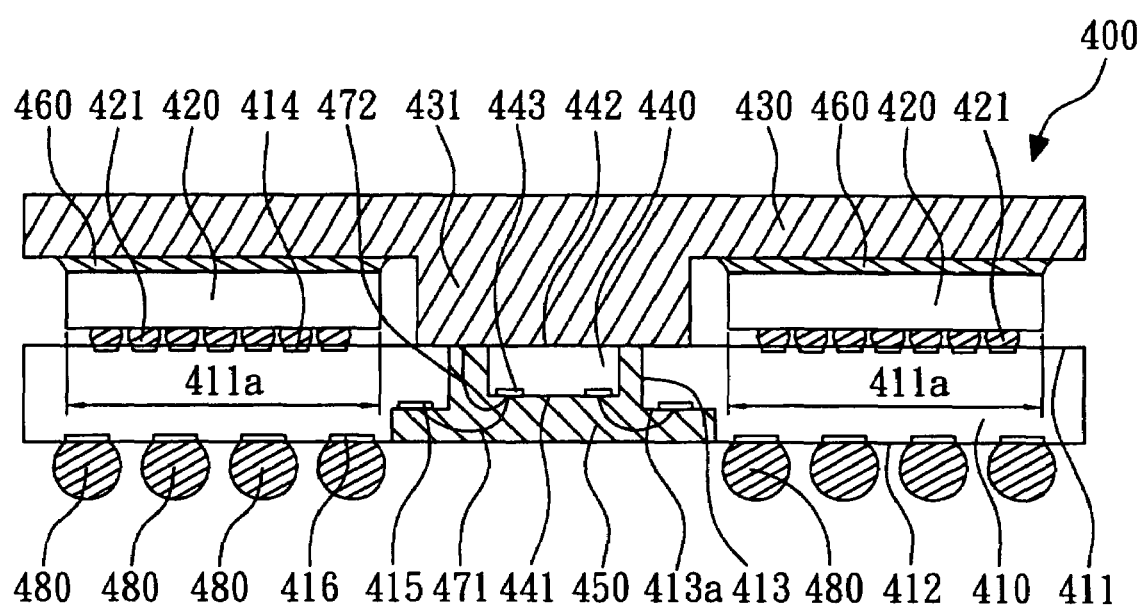
FIG. 5 is a schematic cross-sectional view of a cavity-down multiple-chip package according to a third embodiment of the present invention.

Referring to FIG. 5, according to the third embodiment of the present invention, a cavity-down multiple-chip package 400 mainly comprises a circuit substrate 410, a plurality of electronic elements 420, a heat spreader 430, a chip 440, and a molding compound 450.

The circuit substrate 410 is provided with an upper surface 411, a lower surface 412, and a cavity 413. In this embodiment, the cavity 413 passes through the upper surface 411 and the lower surface 412 of the circuit substrate 410. The upper surface 411 of the circuit substrate 410 defines a plurality of element mounting areas 411a, which have a plurality of mounting pads 414 formed therein and are used for being disposed with the electronic elements 420.

The electronic elements 420 are disposed within the element mounting areas 411a of the circuit substrate 410. In this embodiment, the electronic elements 420 are Chip Size Package (CSP) that are jointed to the mounting pads 424 in the element mounting areas 411a by a plurality of solder balls 421.

The heat spreader 430 is disposed on the upper surface of these electronic elements 420 with an adhesive 460, and the heat spreader 430 comprises a protrusion 431 at the central position. The protrusion 431 is aligned with the cavity 413.

The chip 440 is provided with an active surface 441 and a non-active surface 442, and the chip 440 further comprises a plurality of solder pads 443 formed on the active surface 441. The chip 440 is accommodated in the cavity 413. In this embodiment, the non-active surface 442 of the chip 440 is attached to the protrusion 431 of the heat spreader 430, and the heat generated during operation of the chip 440 is transferred through the heat spreader 430. A plurality of bonding wires 471 are used for electrically connecting the solder pads 443 of the chip 440 to the connecting pads 415 of the circuit substrate 410. The connecting pads 415 can be formed on a step 413a within the cavity 413. Preferably, at least one ground bonding wire 472 is used for connecting a portion of the solder pads 443 of the chip 440 to the heat spreader 430, which is used as ground connection or electrical shield.

The molding compound 450 is formed within the cavity 413 so as to seal the chip 440, the bonding wires 471 and the ground bonding wire 472. The exposed surface of the molding compound 450 may not protrude from the lower surface 412 of the circuit substrate 410. A plurality of ball pads 416 are formed on the lower surface 412 of the circuit substrate 410, and are used for being disposed with a plurality of solder balls 480.

As for the above-mentioned cavity-down multiple-chip package 400, the electronic elements 420 are disposed on the element mounting areas 411a on the upper surface 411 of the circuit substrate 410. The chip 440 is accommodated within the cavity 413 with an opening facing the lower surface 412 so as to achieve high-density packaging of the chip 440 and the electronic elements 420. Additionally, the cavity-down multiple-chip package 400 has a relatively small footprint area.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A cavity-down multiple-chip package, comprising:
   a first heat spreader comprising at least one through hole located at peripheral areas of a circuit substrate, the first heat spreader being a flat plate,
   the circuit substrate having an upper surface, a lower surface, and an opening, wherein the upper surface defines at least one element mounting area, the first heat spreader is disposed on the upper surface of the circuit substrate, the element mounting area is exposed, and the through hole of the first heat spreader does not communicate with the opening of the circuit substrate;
   a chip accommodated in the opening and electrically connected to the circuit substrate;
   a molding compound formed in the opening for sealing the chip;
   at least one electronic element disposed on the element mounting area on the upper surface of the circuit substrate and disposed in the through hole of the first heat spreader; and
   a second heat spreader disposed on the first heat spreader, wherein the second heat spreader comprises a protrusion that corresponds to the opening and is connected to the first heat spreader, and the second heat spreader is physically connected and thermally coupled to the electronic element.

2. The cavity-down multiple-chip package according to claim 1, wherein the through hole exposes the element mounting area on the upper surface of the circuit substrate.

3. The cavity-down multiple-chip package according to claim 1, further comprising a plurality of solder balls disposed on the lower surface of the circuit substrate.

4. The cavity-down multiple-chip package according to claim 1, wherein the electronic element is selected from a group consisting of Flip Chip, Chip Size Package (CSP) and Ball Grid Array (BGA).

5. The cavity-down multiple-chip package according to claim 1, wherein the opening is located in a central area of the circuit substrate, and the element mounting area is located at the peripheral areas of the upper surface of the circuit substrate.

* * * * *